(12) United States Patent
Ko et al.

(10) Patent No.:  US 12,575,027 B2
(45) Date of Patent:  Mar. 10, 2026

(54) PRINTED CIRCUIT BOARD

(71) Applicant: SAMSUNG ELECTRO-MECHANICS CO., LTD., Suwon-si (KR)

(72) Inventors: Young Kuk Ko, Suwon-si (KR); Sang Hoon Kim, Suwon-si (KR); Ji Ho Yoon, Suwon-si (KR); Gyu Mook Kim, Suwon-si (KR); Tae Hun Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 226 days.

(21) Appl. No.: 18/641,923

(22) Filed: Apr. 22, 2024

(65) Prior Publication Data

US 2025/0081337 A1  Mar. 6, 2025

(30) Foreign Application Priority Data

Sep. 1, 2023  (KR) ......................... 10-2023-0116123

(51) Int. Cl.

| | |
|---|---|
| *H05K 1/02* | (2006.01) |
| *H05K 1/11* | (2006.01) |
| *H05K 1/18* | (2026.01) |
| *H05K 1/183* | (2026.01) |

(52) U.S. Cl.
CPC ........... *H05K 1/0298* (2013.01); *H05K 1/111* (2013.01); *H05K 1/115* (2013.01); *H05K 1/183* (2013.01); *H05K 2201/094* (2013.01); *H05K 2201/096* (2013.01); *H05K 2201/09827* (2013.01)

(58) Field of Classification Search
CPC .... H05K 3/4682; H05K 3/4697; H05K 1/183; H05K 1/185; H05K 2201/09827
See application file for complete search history.

(56) References Cited

U.S. PATENT DOCUMENTS

| | | | |
|---|---|---|---|
| 2010/0147560 A1 | 6/2010 | Kaneko | |
| 2017/0019989 A1 | 1/2017 | Lee | |
| 2022/0377902 A1* | 11/2022 | Shin ....................... | H05K 1/111 |

(Continued)

FOREIGN PATENT DOCUMENTS

| | | |
|---|---|---|
| JP | 2010-141204 A | 6/2010 |
| KR | 10-2017-0009128 A | 1/2017 |

*Primary Examiner* — Nathan Milakovich

(74) *Attorney, Agent, or Firm* — Morgan, Lewis & Bockius LLP

(57) ABSTRACT

A printed circuit board includes: a first insulating layer; a cavity unit including a first cavity penetrating through a portion of the first insulating layer from an upper surface thereof in a thickness direction, and a second cavity penetrating through another portion of the first insulating layer from the first cavity; a first wiring layer disposed at an upper side of the first insulating layer; a second wiring layer disposed at a lower side of the first insulating layer; and a third wiring layer at least partially buried in the first insulating layer and disposed on a level between the first and second wiring layers in the thickness direction. The third wiring layer includes pads in which at least a portion of each of upper surfaces thereof is exposed from the first insulating layer through the cavity unit, and the first cavity has a wider cross-section than the second cavity.

19 Claims, 12 Drawing Sheets

(56) References Cited

U.S. PATENT DOCUMENTS

| | | | |
|---|---|---|---|
| 2023/0300975 A1* | 9/2023 | Proschwitz | H01L 23/13 |
| | | | 257/773 |
| 2024/0138077 A1* | 4/2024 | Shin | H05K 3/4688 |
| 2025/0071898 A1* | 2/2025 | Lee | H05K 3/4697 |
| 2025/0126712 A1* | 4/2025 | Ko | H05K 3/4697 |

* cited by examiner

PRINTED CIRCUIT BOARD

CROSS-REFERENCE TO RELATED APPLICATION(S)

This application claims benefit of priority to Korean Patent Application No. 10-2023-0116123 filed on Sep. 1, 2023, in the Korean Intellectual Property Office, the disclosure of which is incorporated herein by reference in its entirety.

TECHNICAL FIELD

The present disclosure relates to a printed circuit board.

As the performance of smartphones improves, a thickness of an electronic component mounted on a package substrate is increasing, but a thickness of a set needs to be reduced or maintained. Accordingly, there is demand for forming a cavity for mounting the electronic component on the package substrate.

SUMMARY

One of various objects of the present disclosure is to provide a printed circuit board that may be thinned while including a cavity that allows for mounting of an electronic component.

Another object of the present disclosure is to provide a printed circuit board that may improve thermal characteristics by increasing a thickness of an electronic component mounted in a cavity.

Another object of the present disclosure is to provide a printed circuit board that may be applied to a board-on-board or package-on-package to reduce a gap between boards.

One of various aspects of the present disclosure is to include first and second cavities of different sizes in a printed circuit board applied as a lower substrate in a substrate-on-substrate or package-on-package, and to form a cavity unit capable of exposing a plurality of pads buried on a level between a plurality of wiring layers based on a thickness direction.

For example, according to an aspect of the present disclosure, a printed circuit board may include: a first insulating layer; a cavity unit including a first cavity penetrating through a portion of the first insulating layer from an upper surface of the first insulating layer in a thickness direction, and a second cavity penetrating through another portion of the first insulating layer from the first cavity in the thickness direction; a first wiring layer disposed at an upper side of the first insulating layer; a second wiring layer disposed at a lower side of the first insulating layer; and a third wiring layer at least partially buried in the first insulating layer and disposed on a level between the first and second wiring layers in the thickness direction. The third wiring layer may include a plurality of pads in which at least a portion of each of upper surfaces thereof is exposed from the first insulating layer through the cavity unit, and the first cavity may have a wider cross-section than the second cavity.

For example, according to an aspect of the present disclosure, a printed circuit board may include: a first insulating layer; a first cavity unit including a first cavity penetrating through a portion of the first insulating layer from an upper surface of the first insulating layer in a thickness direction, and a second cavity penetrating through another portion of the first insulating layer from the first cavity in the thickness direction, a first wiring layer disposed at an upper side of the first insulating layer; a second wiring layer disposed at a lower side of the first insulating layer; and a third wiring layer at least partially buried in the first insulating layer and disposed on a level between the first and second wiring layers in the thickness direction. The third wiring layer may include a plurality of pads in which at least a portion of each of upper surfaces thereof is exposed from the first insulating layer through the first cavity unit, and the first cavity may have a larger area on a plane than the second cavity.

As one of various effects of the present disclosure, it may be possible to provide a printed circuit board that may be thinned while including a cavity for mounting an electronic component.

As another effect of the present disclosure, it may be possible to provide a printed circuit board that may improve thermal characteristics by increasing a thickness of an electronic component mounted in a cavity.

As another effect of the present disclosure, it may be possible to provide a printed circuit board applied to a board-on-board or package-on-package to reduce a gap between boards.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
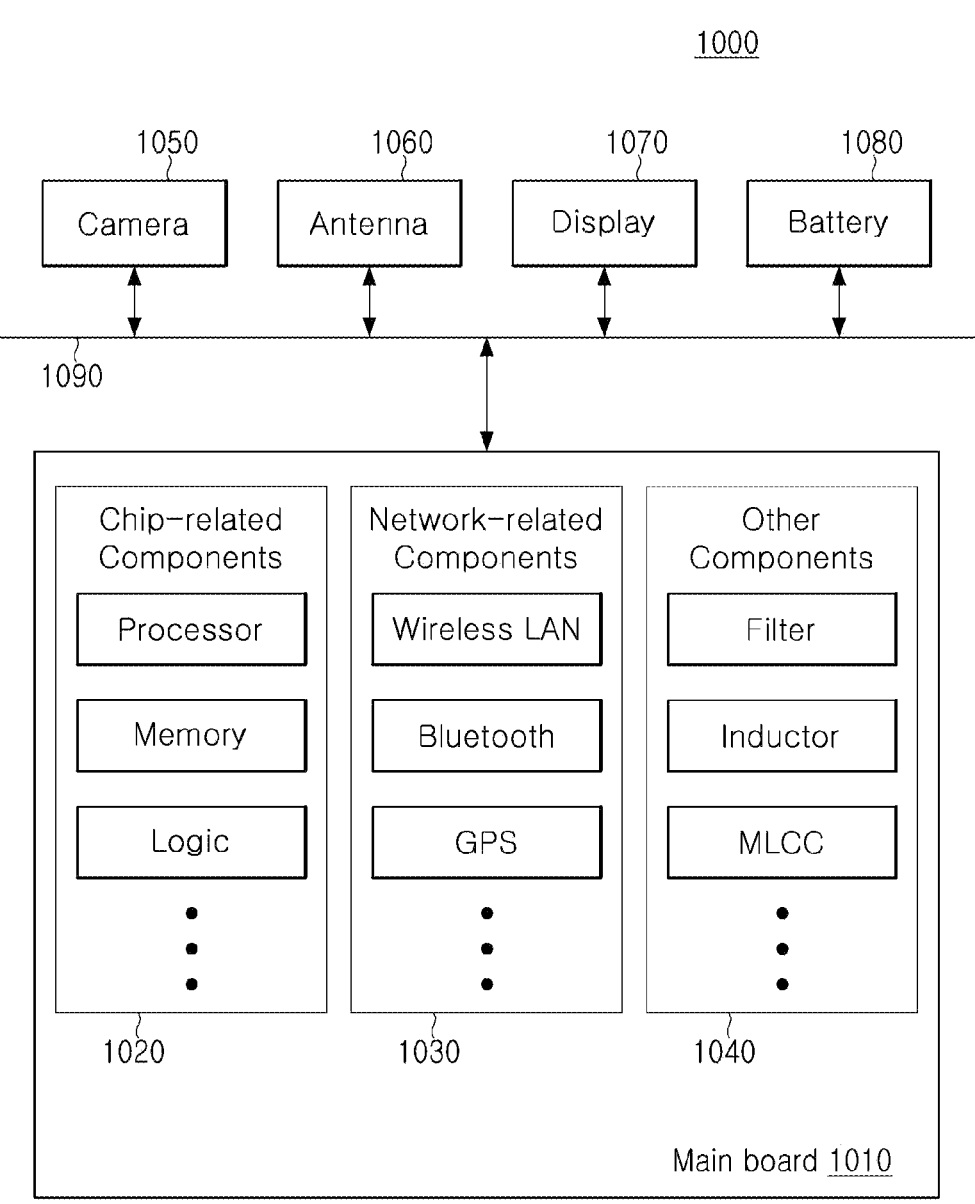
FIG. 1 is a block diagram schematically illustrating an example of an electronic device system.

Hereinafter, the present disclosure will be described with reference to the accompanying drawings. In the drawings, the shape and size of the elements may be exaggerated or reduced for clarity of description.

Electronic Device

FIG. 1 is a block diagram schematically illustrating an example of an electronic device system.

Referring to FIG. 1, an electronic device 1000 accommodates a main board 1010 therein. Chip-related components 1020, network-related components 1030, and other components 1040, and the like, are physically and/or electrically connected to the main board 1010. These components are also coupled to other electronic components to be described below to form various signal lines 1090.

The chip-related components 1020 may include a memory chip such as a volatile memory (e.g., a DRAM), a non-volatile memory (e.g., a ROM), a flash memory, or the like; an application processor chip such as a central processor (e.g., a CPU), a graphics processor (e.g., a GPU), a digital signal processor, a cryptographic processor, a microprocessor, a microcontroller, or the like; and a logic chip such as an analog-to-digital (ADC) converter, an application-specific IC (ASIC), or the like. However, the chip-related components 1020 are not limited thereto, and may also include other types of chip-related electronic components. Furthermore, the chip-related components 1020 may be coupled to each other. The chip-related component 1020 may be in the form of a package including the above-described chip or electronic component.

The network-related components 1030 may include wireless fidelity (Wi-Fi) (such as IEEE 802.11 family), worldwide interoperability for microwave access (WiMAX) (such as IEEE 802.16 family), IEEE 802.20, long term evolution (LTE), evolution data only (Ev-DO), HSPA+, HSDPA+, HSUPA+, EDGE, GSM, GPS, GPRS, CDMA, TDMA, DECT, Bluetooth, 3G, 4G, and 5G protocols, and any other wireless and wired standards or protocols specified thereafter. However, the network-related components 1030 are not limited thereto, and may also include any of a number of other wireless or wired standards or protocols. Furthermore, the network-related components 1030 may be coupled to the chip-related components 1020.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), or the like. However, other components are not limited thereto, and may also include passive components in the form of chip components used for various other purposes. In addition, other components 1040 may be coupled to each other, together with the chip-related components 1020 and/or the network-related components 1030.

Depending on a type of electronic device 1000, the electronic device 1000 may include other electronic components that may or may not be physically and/or electrically connected to main board 1010. These other electronic components may include, for example, a camera module 1050, an antenna module 1060, a display 1070, and a battery 1080. However, these other electronic components are not limited thereto, but may also include an audio codec, a video codec, a power amplifier, a compass, an accelerometer, a gyroscope, a speaker, a mass storage device (e.g., a hard disk drive), a compact disk (CD), a digital versatile disk (DVD), or the like. Furthermore, these other electronic components may also other electronic components used for various purposes depending on a type of electronic device 1000.

The electronic device 1000 may be a smartphone, a personal digital assistant, a digital video camera, a digital still camera, a network system, a computer, a monitor, a tablet PC, a laptop PC, a netbook PC, a television, a video game machine, a smartwatch, an automotive component. However, the electronic device 1000 is not limited thereto, and may be any other electronic device that processes data in addition thereto.

Figure 2:
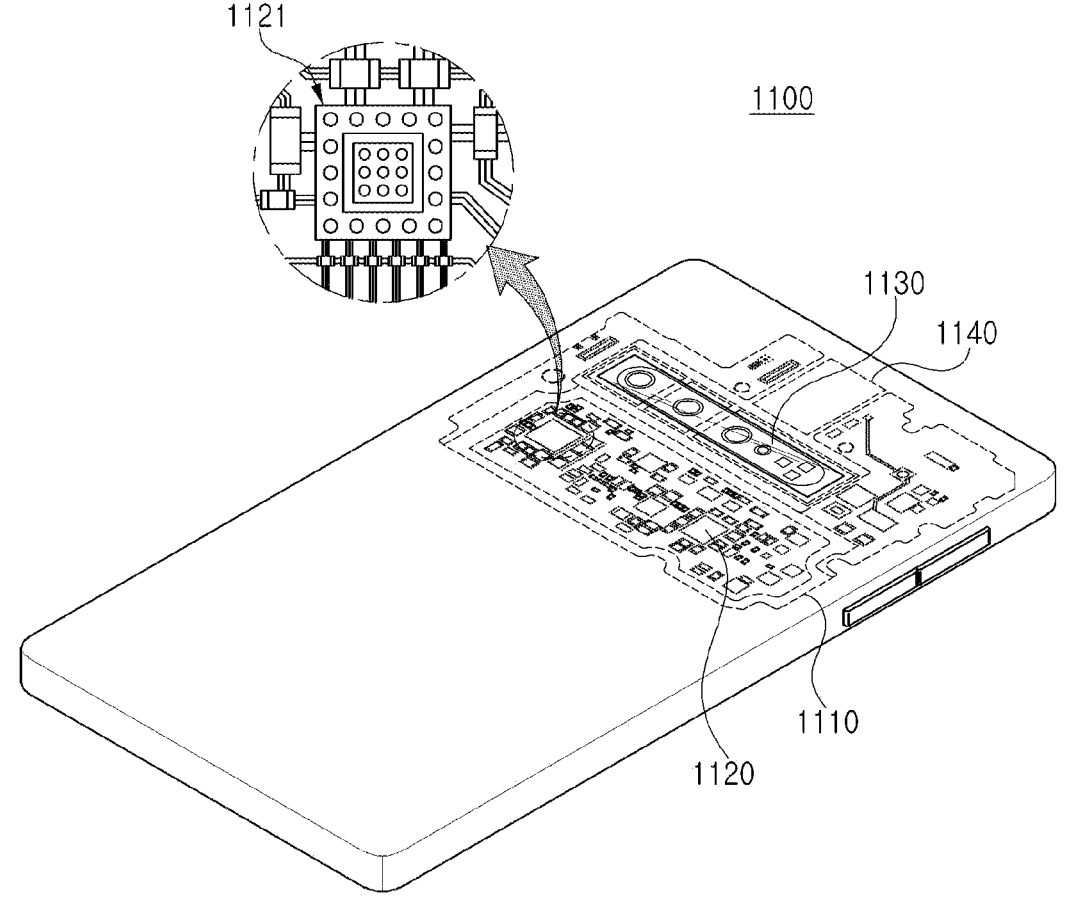
FIG. 2 is a perspective view schematically illustrating an example of an electronic device.

FIG. 2 is a perspective view schematically illustrating an example of an electronic device.

Referring to FIG. 2, an electronic device may be, for example, a smartphone 1100. A motherboard 1110 may be accommodated in the smartphone 1100, and various components 1120 may be physically and/or electrically connected to the motherboard 1110. Furthermore, other components that may or may not be physically and/or electrically connected to the motherboard 1110, such as a camera module 1130 and/or a speaker 1140, may be accommodated in the smartphone 1100. Some of the components 1120 may be the chip-related components described above, for example, the component package 1121, but the present disclosure is not limited thereto. The component package 1121 may have the form of a printed circuit board in which an electronic component including an active component and/or a passive component is mounted on a surface. Alternatively, the component package 1121 may have the form of a printed circuit board in which an active component and/or a passive component are embedded. On the other hand, the electronic device is not necessarily limited to the smartphone 1100, and may be other electronic devices as described above.

Printed Circuit Board

Figure 3:
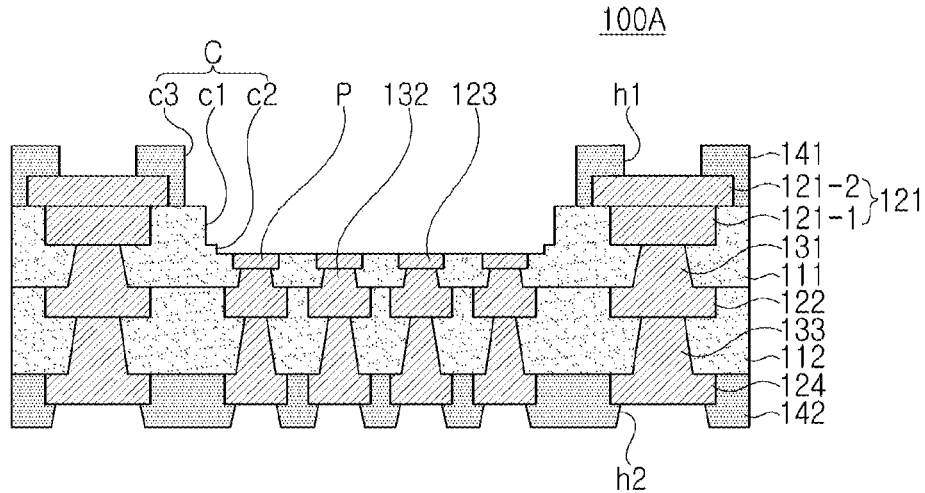
FIG. 3 is a cross-sectional view schematically illustrating an example embodiment of a printed circuit board.

FIG. 3 is a cross-sectional view schematically illustrating an example embodiment of a printed circuit board.

Figure 4:
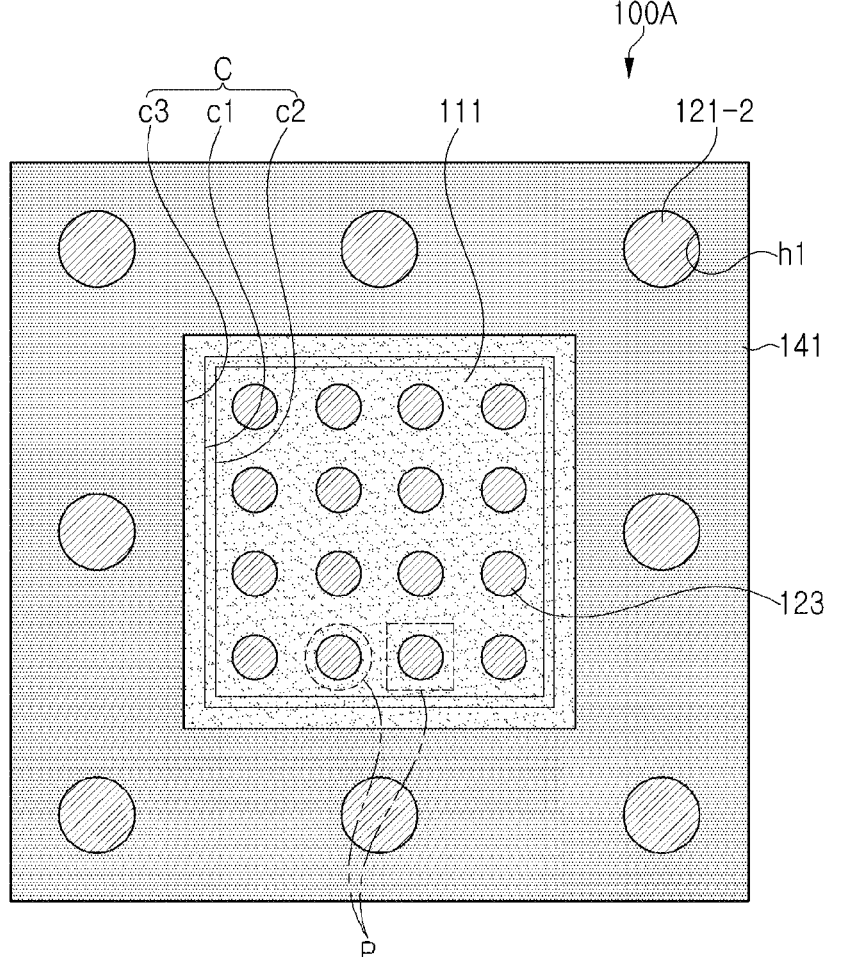
FIG. 4 is a schematic plan view illustrating a top-view of the printed circuit board of FIG. 3.

FIG. 4 is a schematic plan view illustrating a top-view of the printed circuit board of FIG. 3.

Referring to the drawings, a printed circuit board 100A according to an example embodiment may include a first insulating layer 111, a cavity unit C including a first cavity c1 penetrating through a portion of the first insulating layer 111 from an upper surface of the first insulating layer 111 in a thickness direction and a second cavity c2 penetrating through another portion of the first insulating layer 111 from the first cavity c1 in the thickness direction, a first wiring layer 121 disposed at an upper side of the first insulating layer 111, a second wiring layer 122 disposed at a lower side of the first insulating layer 111, and a third wiring layer 123 at least partially buried in the first insulating layer 111 and disposed on a level between the first and second wiring layers 121 and 122 in the thickness direction. The third wiring layer 123 may include a plurality of pads P in which at least a portion of each of upper surfaces is exposed from the first insulating layer 111 through the cavity unit C. A size of the first cavity c1 may be larger than a size of the second cavity c2. For example, the width in cross section may be wider, the area in plane may be larger, and the depth in the thickness direction may be greater. For example, the first cavity c1 may be wider in cross-section than the second cavity c2, the first cavity c1 may have a larger area in plan view than the second cavity c2, and the first cavity c1 may be deeper in the thickness direction than the second cavity c2.

In this manner, the printed circuit board 100A according to an example embodiment may have a cavity unit C including first and second cavities c1 and c2 of different sizes formed in the first insulating layer 111, and the cavity unit C may be buried in the first insulating layer 111 and may expose a plurality of pads P disposed on a level between the first and second wiring layers 121 and 122 based on the thickness direction. Accordingly, even when an electronic component is mounted in the cavity unit C, an overall thickness of the printed circuit board 100A may be reduced by the cavity unit C. Additionally, as the cavity unit C is able to have a considerable depth, a thickness of the mounted electronic component may be increased, and as a result, thermal characteristics may be improved. Additionally, the printed circuit board 100A of this structure may be applied as a lower substrate of a board-on-board or package-on-package, and in this case, a gap between upper and lower substrates may be reduced, so that a size of the solder balls disposed between the substrates may be reduced to expect a finer ball pitch or an increase in the number of input/output terminals.

Meanwhile, the printed circuit board 100A according to an example embodiment may further include a first resist layer 141 disposed on an upper surface of the first insulating layer 111 and having a first opening h1 exposing at least a portion of the first wiring layer 121. The cavity unit C may further include a third cavity c3 connected to the first cavity c1 by penetrating between an upper surface and a lower surface of the first resist layer 141 in the thickness direction. The third cavity c3 may be wider in cross-section and have a larger area in plan view than the first cavity c1. In this manner, the printed circuit board 100A may further have a third cavity c3 of a different size from the first and second cavities c1 and c2 formed in the first resist layer 141. Accordingly, the cavity unit C may be further expanded, and as a result, the above-described effects may be more easily implemented.

Meanwhile, the printed circuit board 100A according to an example embodiment may further include a first via layer 131 penetrating through the first insulating layer 111 and connecting at least a portion of each of the first and second wiring layers 121 and 122 to each other, and a second via layer 132 penetrating the first insulating layer 111 and connecting at least a portion of each of the second and third wiring layers 122 and 123 to each other. The first via layer 131 may be thicker in a cross-section than the second via layer 132. In this manner, a second via layer 132 that is thinner than the first via layer 131 may be formed in the first insulating layer 111, through which the plurality of pads P may be connected to the second wiring layer 122 through a shorter path. Accordingly, an electrical connection path of the electronic component mounted in the cavity unit C may be further shortened, and as a result, signal characteristics, and the like, may be further improved.

Meanwhile, the printed circuit board 100A according to an example embodiment may further include a second insulating layer 112 disposed on a lower surface of the first insulating layer 111, a fourth wiring layer 124 disposed on a lower surface of the second insulating layer 112, a third via layer 133 penetrating through the second insulating layer 112 and connecting at least a portion of each of the second and fourth wiring layers 122 and 124 to each other, and a second resist layer 142 disposed on the lower surface of the second insulating layer 112 and having a second opening h2 exposing at least a portion of the fourth wiring layer 124. Each of the first to third via layers 131, 132 and 133 may have a tapered shape in which a width in a lower end thereof is wider than a width in an upper end thereof in a cross-section. As described above, the printed circuit board 100A may have a multilayer coreless board structure, and, if necessary, may have a multilayer structure more than that illustrated in the drawing.

Meanwhile, the first wiring layer 121 may include a first-first wiring layer 121-1 buried in an upper side of the first insulating layer 111 and a first-second wiring layer 121-2 disposed on an upper surface of the first insulating layer 111. The first-first wiring layer 121-1 and the first-second wiring layer 121-2 may be connected to each other. For example, the first-second wiring layer 121-2 may have a wider cross-section than the first-first wiring layer 121-1, and an upper surface of the first-first wiring layer 121-1 and a lower surface of the first-second wiring layer 121-2 may be in direct contact with each other. Additionally, the first opening h1 of the first resist layer 141 may expose at least a portion of the first-second wiring layer 121-2. As described above, the first wiring layer 121 may have a multilayer form in which buried patterns and protruding patterns of different sizes are connected. Accordingly, by increasing a thickness of the first resist layer 141, a depth of the third cavity c3 may be realized deeper, and further, when applied as a lower substrate in a board-on-board structure or package-on-package structure, the reliability of a connection with the solder ball may be further improved.

Meanwhile, at least two of the plurality of pads P may have different shapes on a plane. For example, while at least one of the plurality of pads P may have a circular shape on a plane, the other at least one may have a rectangular shape on a plane. However, the present disclosure is not limited thereto, and of course, more diverse shapes such as ovals or other polygons can be applied in addition to circles and squares. In this manner, the printed circuit board 100A may form a plurality of pads P of various shapes in the cavity unit C as a feature of a process described below, through which design freedom may be increased.

Meanwhile, a thickness of the first-first wiring layer 121-1 may be substantially the same as a depth of the first cavity c1. For example, the first cavity c1 may be formed by removing a metal block formed in the same process as the first-first wiring layer 121-1. In this manner, the first cavity c1 may be formed using a process of forming the first-first wiring layer 121-1, and accordingly, the cavity unit C may be formed more easily and readily.

Hereinafter, components of the printed circuit board 100A according to an example embodiment will be described in more detail with reference to the drawings.

Each of the first and second insulating layers 111 and 112 may include an insulating material.

The insulating material may include a thermosetting resin such as an epoxy resin, a thermoplastic resin such as polyimide, or a material including an inorganic filler, an organic filler, and/or a glass fiber (Glass Fiber, Glass Cloth or Glass Fabric) along with resins. For example, the insulating material may be a non-photosensitive insulating material such as an Ajinomoto Build-up Film (ABF) or Prepreg (PPG), but the present disclosure is not limited thereto, and other polymer materials may be used as the insulating material. The first and second insulating layers 111 and 112 may include the same insulating material or may include different insulating materials. The first and second insulating layers 111 and 112 may have boundaries with each other, or may be integrated to the extent that the boundaries therebetween are unclear.

Each of the first to fourth wiring layers 121, 122, 123 and 124 may include a metallic material. The metal material may include copper (Cu), aluminum (Al), silver (Ag), tin (Sn), gold (Au), nickel (Ni), lead (Pb), titanium (Ti), and/or alloys thereof. The first to fourth wiring layers 121, 122, 123 and 124 may include, preferably, copper (Cu), but the present disclosure is not limited thereto. Each of the first to fourth wiring layers 121, 122, 123 and 124 may perform various functions depending on a design thereof. For example, the first to fourth wiring layers 121, 122, 123 and 124 may include a signal pattern, a power pattern, and a ground pattern. Each of these patterns may have various forms such as a line, a plane, and a pad. The first to fourth wiring layers 121, 122, 123 and 124 may include an electroless plating layer (or chemical copper) and an electrolytic plating layer (or electrical copper), respectively. The first to fourth wiring layers 121, 122, 123 and 124 may include only an electrolytic plating layer (or electrolytic copper) without an electroless plating layer (or chemical copper). If necessary, the first to fourth wiring layers 121, 122, 123 and 124 may further include a metal foil (or copper foil) or a sputtering layer. Meanwhile, each of the first-second wiring layer 121-2, the second wiring layer 122, and the fourth wiring layer 124 may include a seed layer such as chemical copper and/or copper foil, while the first-first wiring layer 121-1 and the third wiring layer 123 may not include the seed layer.

Each of the first to third via layers 131, 132 and 133 may include a metallic material. The metal material may include copper (Cu), aluminum (Al), silver (Ag), tin (Sn), gold (Au), nickel (Ni), lead (Pb), titanium (Ti), and/or alloys thereof. The first to third via layers 131, 132 and 133 may include, preferably, copper (Cu), but the present disclosure not limited thereto. Each of the first to third via layers 131, 132 and 133 may include a micro via. The micro via may be a filled via filling a via hole, or a conformal via disposed along a wall surface of the via hole. The micro via may be disposed as a stacked type and/or a staggered type. The micro vias of the first to third via layers 131, 132 and 133 may perform various functions depending on the design of a corresponding layer. For example, the first to third via layers 131, 132 and 133 may include a ground via, a power via, and a signal via. Each of the first to third via layers 131, 132 and 133 may include an electroless plating layer (or chemical copper) and an electrolytic plating layer (or electrolytic copper), but the present disclosure is not limited thereto. The first to third via layers 131, 132 and 133 may have a sputtering layer formed instead of the electroless plating layer, and may include both the sputtering layer and the electroless plating layer. Each micro via of the first to third via layers 131, 132 and 133 may have a shape tapered in the same direction.

Each of the first and second resist layers 141 and 142 may include a liquid or film-type solder resist, but is not limited thereto, and may include other types of insulating materials such as the ABF. The first and second resist layers 141 and 142 may have first and second openings h1 and h2, respectively, and may have a surface treatment layer formed on a pattern exposed through the first and second openings h1 and h2 as necessary.

FIGS. 5A to 5J are process cross-sectional views schematically illustrating a manufacturing example of the printed circuit board of FIG. 3.

Figure 5A:
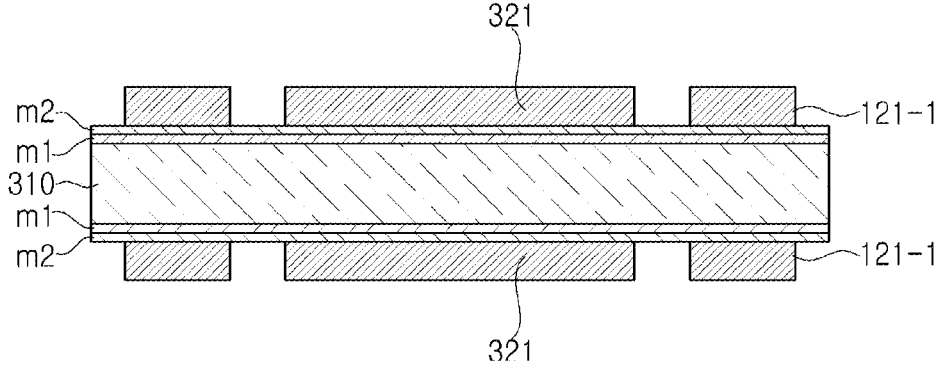
FIGS. 5A to 5J are process cross-sectional views schematically illustrating a manufacturing example of the printed circuit board of FIG. 3.

Referring to FIG. 5A, a first-first wiring layer 121-1 and a first metal block 321 are formed on both surfaces of a detach carrier 310. First and second metal layers m1 and m2 may be disposed on both surfaces of the detach carrier 310, and the first-first wiring layer 121-1 and the first metal block 321 may be formed by, for example, electrolytic plating using the second metal layer m2 as a seed layer.

Figure 5B:
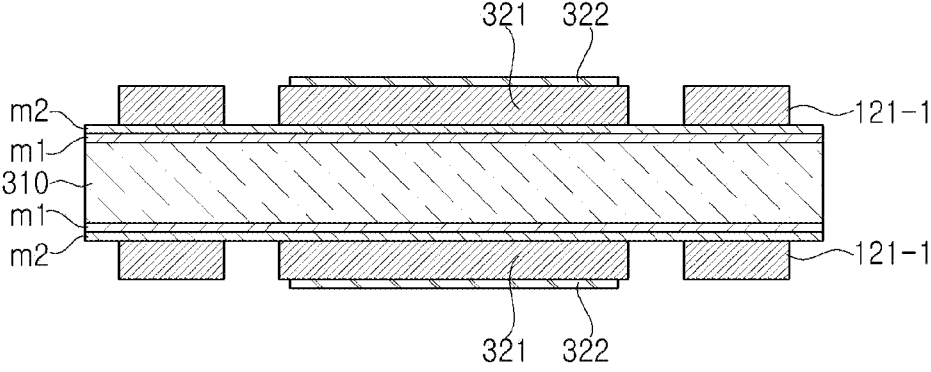

Referring to FIG. 5B, a second metal block 322 is formed on the first metal block 321. The second metal block 322 may be formed by, for example, electrolytic plating using the first metal block 321 as a seed layer. The second metal block 322 may include a different type of metal from the first metal block 321. For example, the first metal block 321 may include copper (Cu), and the second metal block 322 may include nickel (Ni), but the present disclosure is not limited thereto.

Figure 5C:
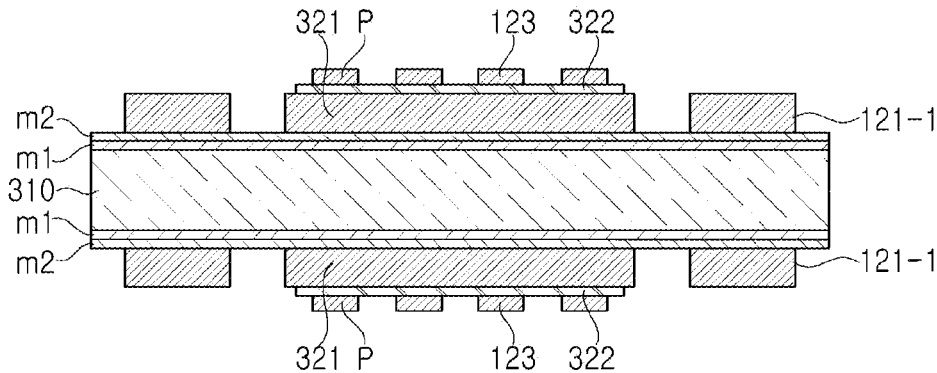

Referring to FIG. 5C, a third wiring layer 123 including a plurality of pads P is formed on the second metal block 322. The third wiring layer 123 may be formed by, for example, electrolytic plating using the second metal block 322 as a seed layer. The plurality of pads P may be formed in various shapes.

Figure 5D:
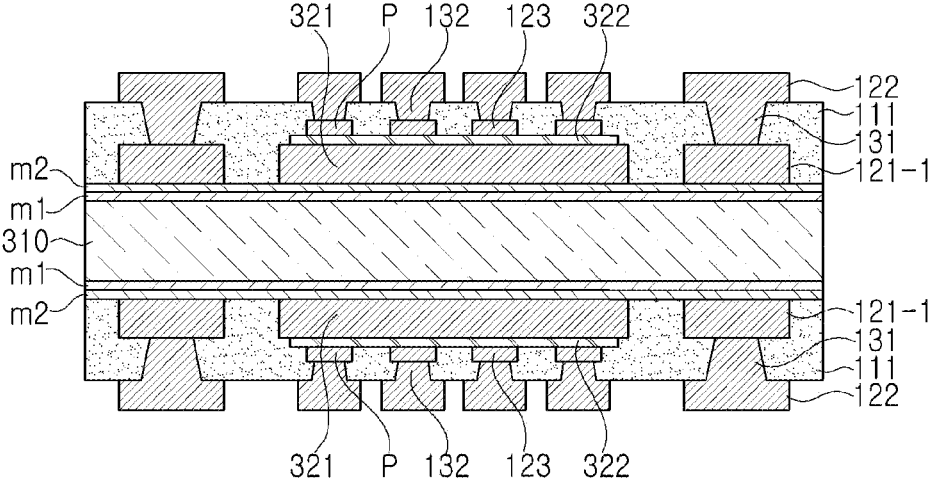

Referring to FIG. 5D, an insulating layer 111 burying the first and second metal blocks 321 and 322, the first-first wiring layer 121-1 and the third wiring layer 123 is formed on both surfaces of the detach carrier 310. The first insulating layer 111 may be formed in a lamination process. Additionally, a second wiring layer 122 and first and second via layers 131 and 132 are formed on the first insulating layer 111. Via holes for the first and second via layers 131 and 132 may be formed through laser processing or the like. The second wiring layer 122 and the first and second via layers 131 and 132 may be formed using, for example, an additive process (AP), a Semi AP (SAP), Modified SAP (MSAP), Tenting (TT), or the like.

Figure 5E:
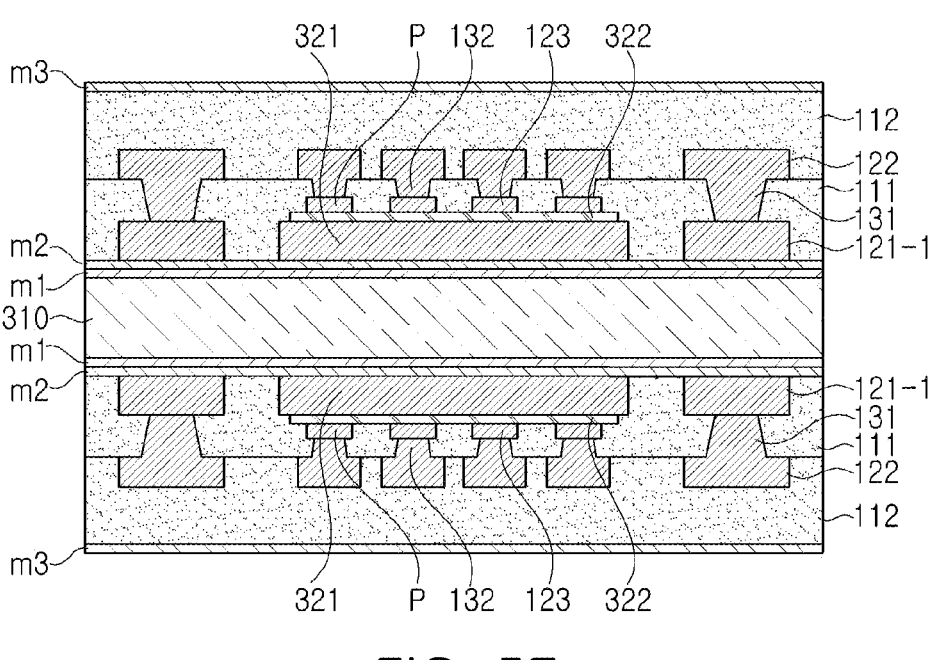

Referring to FIG. 5E, a second insulating layer 112 burying the second wiring layer 122 is formed on the first insulating layer 111. The second insulating layer 112 may be formed in a lamination process. For example, the second insulating layer 112 may be formed by stacking Resin Clad Copper (RCC) or the like. For example, a third metal layer m3 may be stacked on an outermost side of the second insulating layer 112.

Figure 5F:
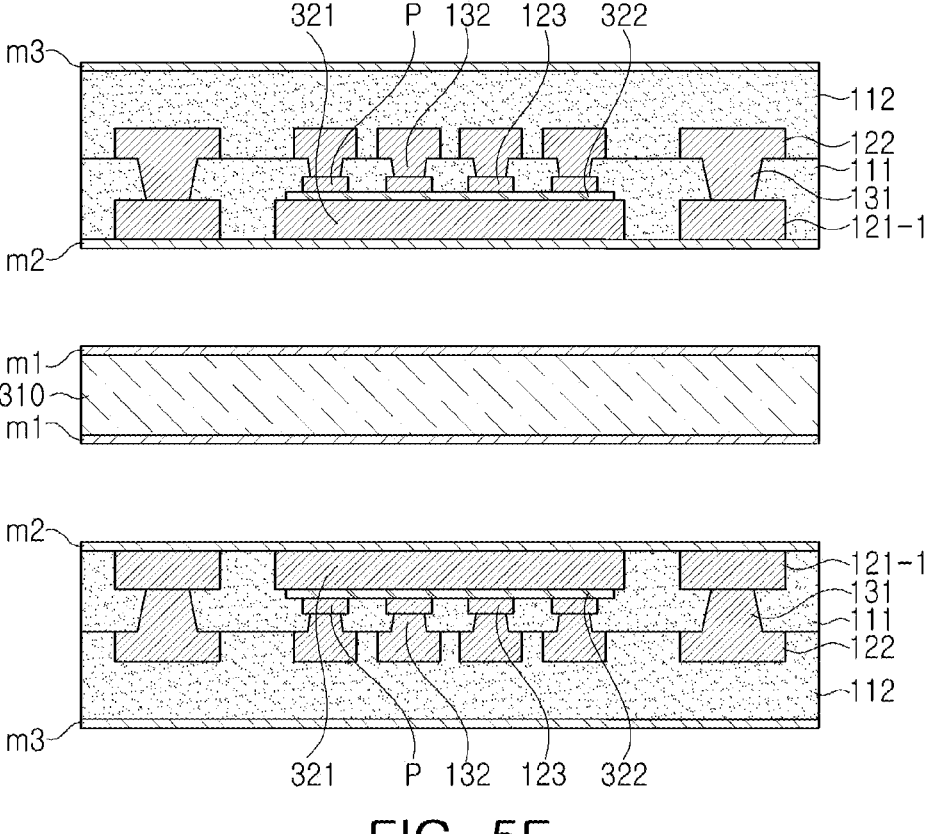

Referring to FIG. 5F, a manufactured stack body is separated from the detach carrier 310. For example, the first and second metal layers m1 and m2 may be separated from each other, and the second metal layer m2 may remain in the separated stack body.

Figure 5G:
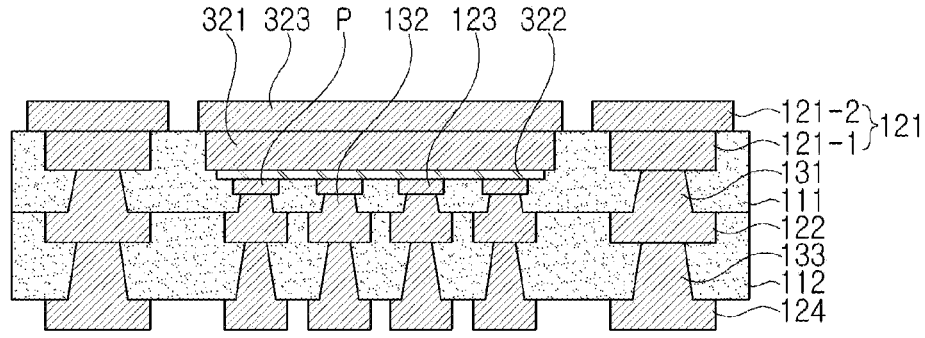

Referring to FIG. 5G, a fourth wiring layer 124 and a third via layer 133 are formed on the second insulating layer 112. Additionally, a first-second wiring layer 121-2 and a third metal block 323 are formed on the first insulating layer 111. The third metal block 323 may include the same metal as the first metal block 321, for example, copper (Cu). A via hole for the third via layer 133 may be formed through laser processing, or the like. The first-second wiring layer 121-2, the fourth wiring layer 124, the third metal block 323, and the third via layer 133 may be formed using, for example, an additive process (AP), Semi AP (SAP), Modified SAP (MSAP), Tenting (TT), or the like. The first-second wiring layer 121-2 and the third metal block 323 may include a first metal layer m1, and the fourth wiring layer 124 may include a third metal layer m3.

Figure 5H:
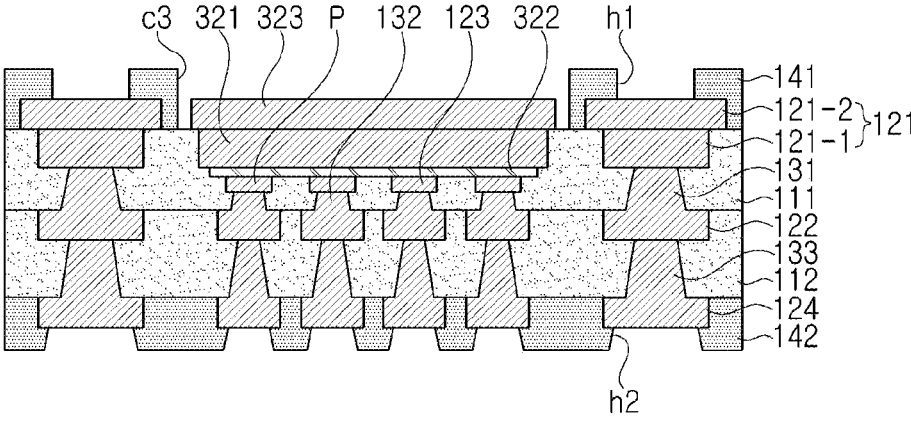

Referring to FIG. 5H, first and second resist layers 141 and 142 are formed on the first and second insulating layers 111 and 112, respectively. The first and second resist layers 141 and 142 may be formed by coating or lamination. Next, first and second openings h1 and h2 and a third cavity c3 are formed in the first and second resist layers 141 and 142. Each of the first and second openings h1 and h2 and the third cavity c3 may be formed by laser processing, but the present disclosure is not limited thereto, and other methods such as etching may be used. A surface exposed through the first and second openings h1 and h2 may be subject to surface treatment such as gold plating.

Figure 5I:
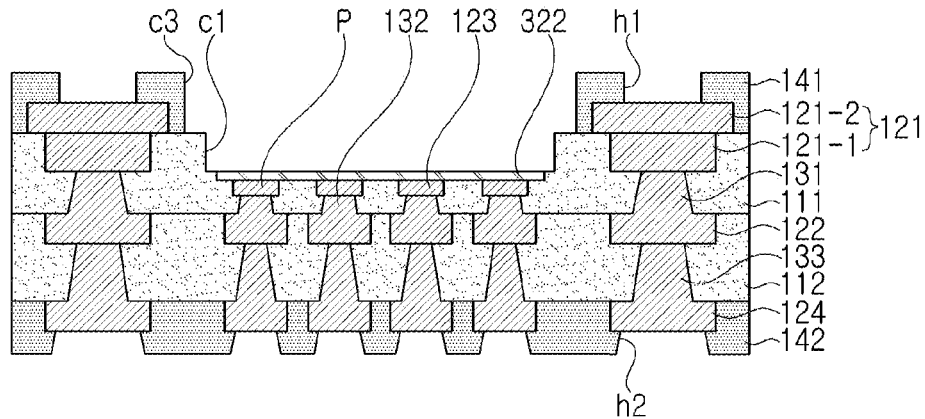

Referring to FIG. 5I, a first cavity c1 is formed in the first insulating layer 111. The first cavity c1 may be formed by etching the first and third metal blocks 321 and 323. The second metal block 323 may include a different type of metal from the first and third metal blocks 321 and 323, thus protecting a plurality of pads P.

Figure 5J:
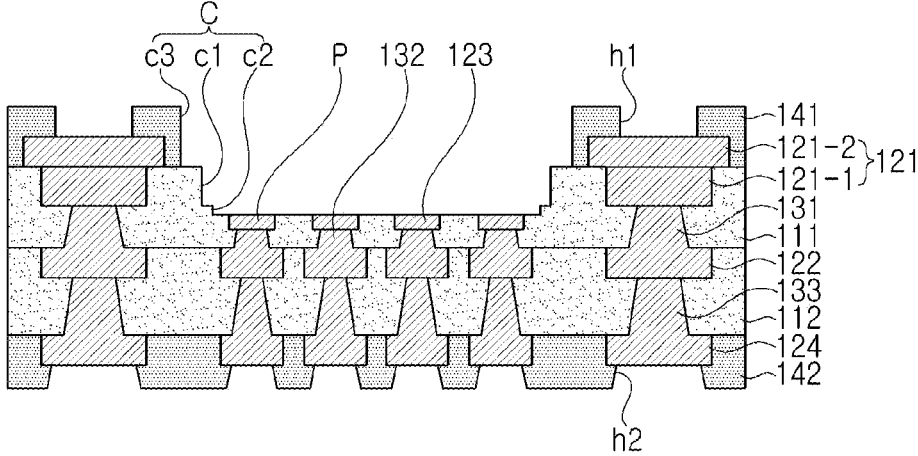

Referring to FIG. 5J, a second cavity c2 is formed in the first insulating layer 111. The second cavity c2 may be formed by etching the second metal block 322. The second metal block 322 may include a different type of metal from the plurality of pads P, and thus, the plurality of pads P may be hardly affected by the etching of this operation. Through a series of processes, the printed circuit board 100A according to the above-described example embodiment may be manufactured.

Other contents are substantially the same as those described in the printed circuit board 100A according to the above-described example embodiment, and therefore, duplicate description thereof will be omitted.

Figure 6:
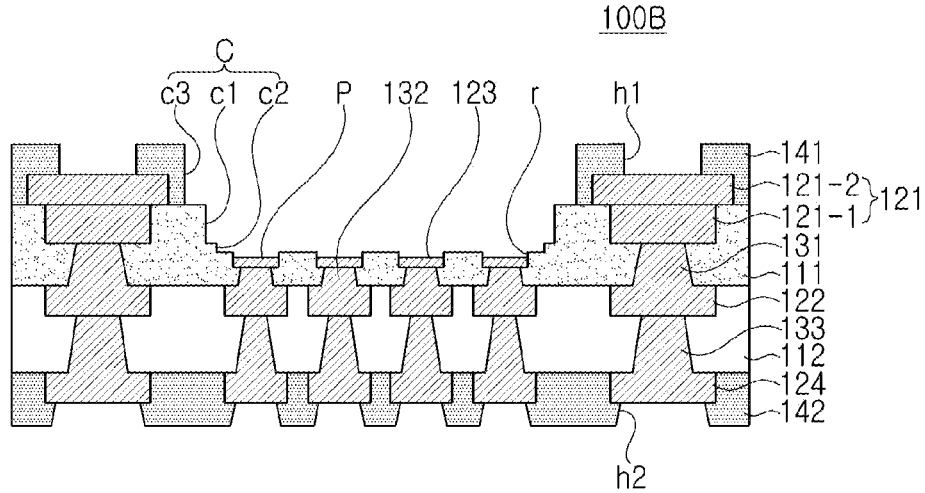
FIG. 6 is a cross-sectional view schematically illustrating an example embodiment of a printed circuit board.

FIG. 6 is a cross-sectional view schematically illustrating an example embodiment of a printed circuit board.

Figure 7:
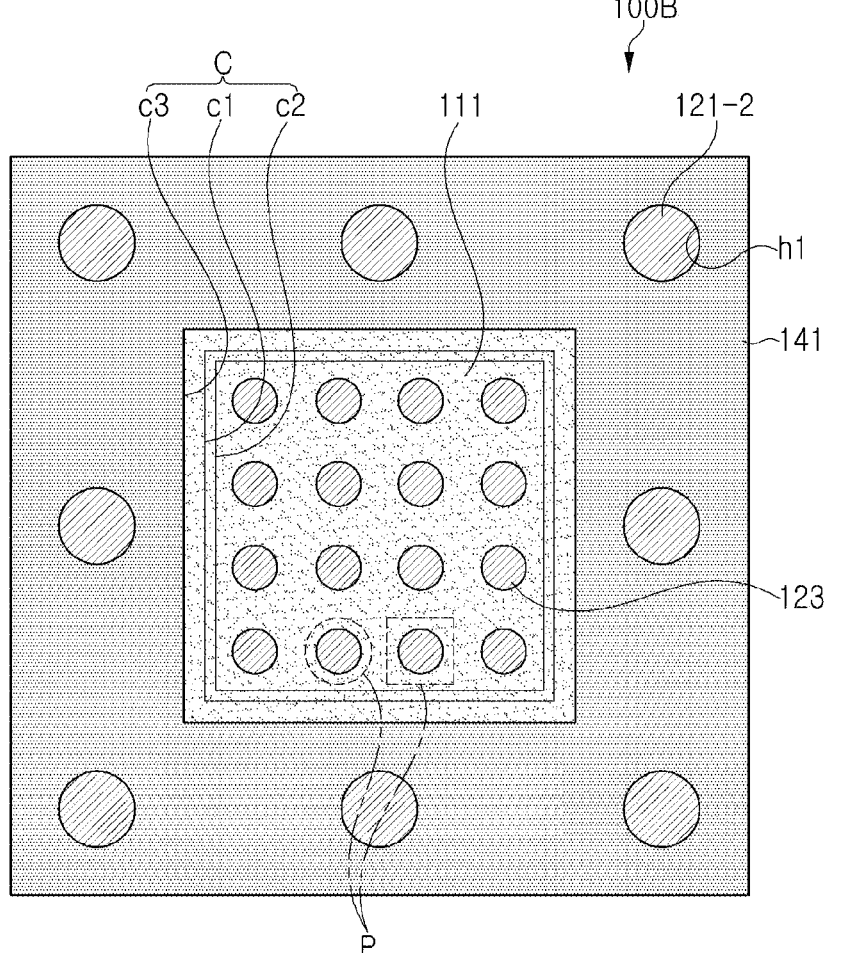
FIG. 7 is a plan view schematically illustrating a top-view of the printed circuit board of FIG. 6.

FIG. 7 is a plan view schematically illustrating a top-view of the printed circuit board of FIG. 6.

Referring to the drawing, in a printed circuit board 100B according to another example embodiment, upper surfaces of each of a plurality of pads P may be recessed downwardly based on a bottom surface of a cavity unit C so as to have a step portion from the bottom surface of the cavity unit C, in the printed circuit board 100A according to the above-described example embodiment. For example, a recess portion r may be formed on the upper surface of each of the plurality of pads P. Electrical connection metals such as solder balls are connected to each other through the recess portion r, thereby more effectively preventing short circuits from occurring. The recess portion r may be formed during an etching process using the same metal as copper (Cu) rather than a different metal such as nickel (Ni), as a material of the above-described second metal block 322, but the present disclosure is not limited thereto.

Other contents are substantially the same as those described in the printed circuit board 100A according to the above-described example embodiment, and thus, duplicate description thereof will be omitted.

Figure 8:
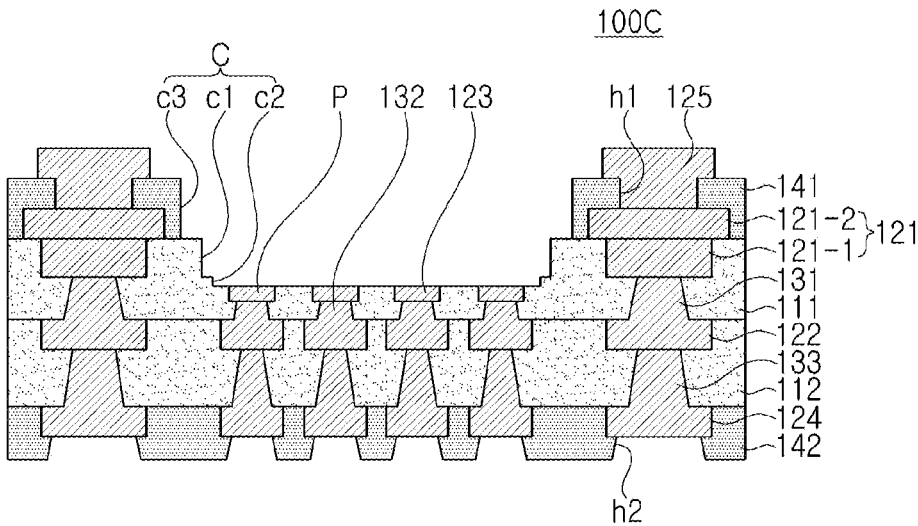
FIG. 8 is a cross-sectional view schematically illustrating another example embodiment of a printed circuit board.

FIG. 8 is a cross-sectional view schematically illustrating another example embodiment of a printed circuit board.

Figure 9:
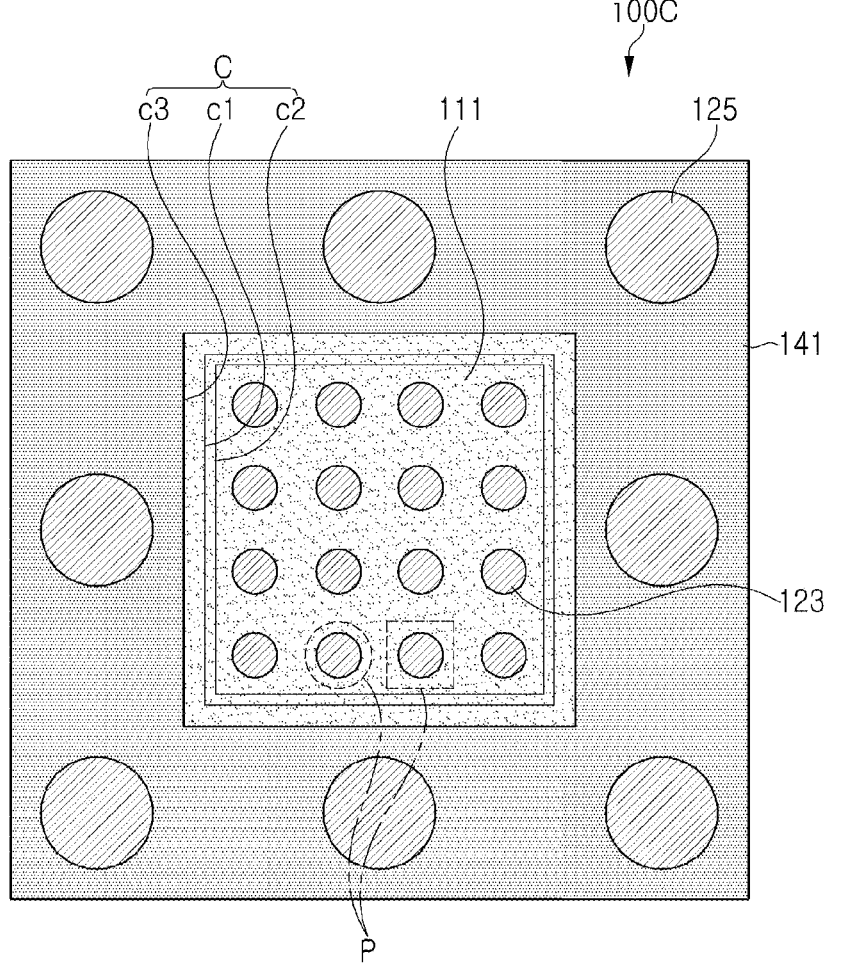
FIG. 9 is a plan view schematically illustrating a top-view of the printed circuit board of FIG. 8.

FIG. 9 is a plan view schematically illustrating a top-view of the printed circuit board of FIG. 8.

Referring to the drawings, a printed circuit board 100C according to another example embodiment may further include a post portion 125 disposed on an upper surface of the first resist layer 141, filling at least a portion of the first opening h1, and connected to at least an exposed portion of a first-second wiring layer 121-2, in the printed circuit board 100A according to the above-described example embodiment. An effect of a cavity unit C may be further enhanced through the post portion 125. The post portion 125 may be formed in a plating process such as electroless plating (or chemical copper) and electrolytic plating (or electrolytic copper). The post portion 125 may include various posts, such as a signal post, a power post, and a ground post. The post portion 125 may include the above-described metallic material such as copper (Cu).

Other contents are substantially the same as those described in the printed circuit board 100A according to the above-described example embodiment, and thus, duplicate description thereof will be omitted.

Figure 10:
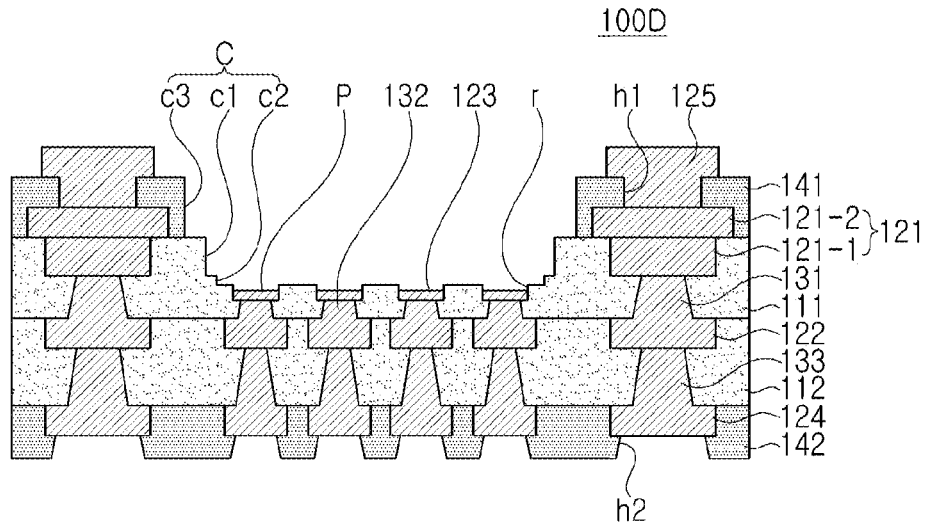
FIG. 10 is a cross-sectional view schematically illustrating another example embodiment of a printed circuit board.
Figure 11:
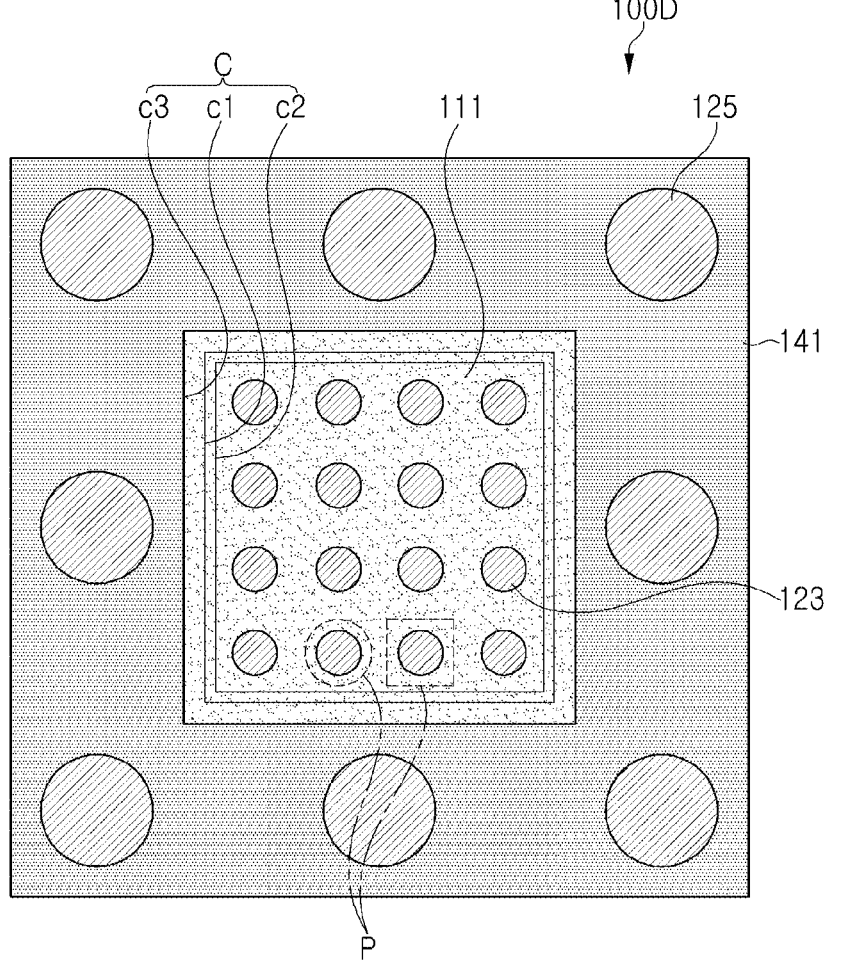
FIG. 11 is a plan view schematically illustrating a top-view of the printed circuit board of FIG. 10.

FIG. 10 is a cross-sectional view schematically illustrating another example embodiment of a printed circuit board, and FIG. 11 is a plan view schematically illustrating a top-view of the printed circuit board of FIG. 10.

Referring to the drawings, in a printed circuit board 100D according to another example embodiment, upper surfaces of each of the plurality of pads P may be recessed downwardly based on the bottom surface of the cavity unit C so as to have a step portion from the bottom surface of the cavity unit C, in the printed circuit board 100A according to the above-described example embodiment. For example, a recess portion r may be formed on the upper surface of each of the plurality of pads P. Electrical connection metals such as solder balls may be connected to each other through the recess portion r, thereby more effectively preventing short circuits from occurring. The recess portion r may be formed during the etching process using the same metal as copper (Cu) rather than a different metal such as nickel (Ni), as a material of the above-described second metal block 322, but the present disclosure is not limited thereto. Additionally, the printed circuit board 100D may further include a post portion 125 disposed on the upper surface of the first resist layer 141, filling at least a portion of the first opening h1, and connected to at least an exposed portion of the first-second wiring layer 121-2. An effect of the cavity portion C may be further enhanced through the post portion 125. The post portion 125 may be formed through a plating process such as electroless plating (or chemical copper) and electrolytic plating (or electrolytic copper). The post portion 125 may include various posts, such as a signal post, a power post, and a ground post. The post portion 125 may include the above-described metallic material such as copper (Cu).

Other contents are substantially the same as those described in the printed circuit board 100A according to the above-described example embodiment, and thus, duplicate description thereof will be omitted.

Figure 12:
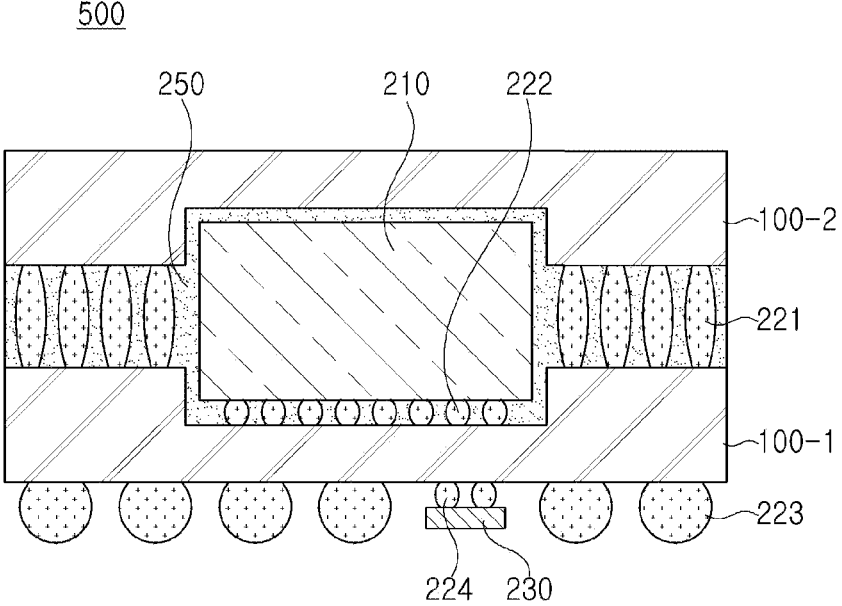
FIG. 12 is a cross-sectional view schematically illustrating an example embodiment of a substrate-on-substrate structure or a package-on-package structure.

FIG. 12 is a cross-sectional view schematically illustrating an example embodiment of a substrate-on-substrate structure or a package-on-package structure.

Referring to FIG. 12, in a substrate-on-substrate or package-on-package structure 500 according to an example embodiment, a second substrate 100-2 may be disposed on a first substrate 100-1, an electronic component 210 may be disposed between the first and second substrates 100-1 and 100-2, the first and second substrates 100-1 and 100-2 may be connected through a first electrical connection metal 221, the electronic component 210 may be mounted on the first substrate 100-1 through the second electrical connection metal 222, first and second cavity units C1 and C2 of the first and second substrates 100-1 and 100-2 may at least partially overlap each other in the thickness direction, at least a portion of the electronic component 210 and at least another portion may be disposed in the first and second cavity units C1 and C2 of the first and second substrates 100-1 and 100-2, respectively, a third electrical connection metal 223 may be attached to a lower side of the first substrate 100-1, a passive component 230 may be mounted on the lower side of the first substrate 100-1 through a fourth electrical connection metal 224, and a space between the first and second substrates 100-1 and 100-2 may be filled with a known molding material 250. The first substrate 100-1 may be at least one of the above-described printed circuit boards 100A, 100B, 100C and 100D. For example, the second substrate 100-2 may be connected to the above-described first wiring layer 121 and/or the above-described post portion 125 through a plurality of first electrical connection metals 221. Additionally, the electronic component 210 may be connected to the plurality of pads P described above through a plurality of second electrical connection metals 222. The second substrate 100-2 may be a core type or coreless type wiring board. The wiring board may be an organic interposer, but is not limited thereto, and may be a silicon interposer if necessary. The electronic component 210 may be an active component and/or a passive component, and may include, preferably, a semiconductor chip, but the present disclosure is not limited thereto. The passive component 230 may be a chip capacitor and/or a chip inductor, but the present disclosure is not limited thereto. Each of the first to fourth electrical connection metals 221, 222, 223 and 224 may be a solder ball or the like. This substrate-on-substrate or package-on-package structure 500 may reduce a gap between the first and second substrates 100-1 and 100-2, and may thus reduce a size of the first electrical connection metal 221 disposed between the substrates, thereby expecting a finer ball pitch or an increase in the number of input/output terminals. Additionally, an overall thickness may be minimized, and the electronic component 210 may still have a sufficient thickness. Accordingly, thermal characteristics may be improved.

Other contents are substantially the same as those described for the above-mentioned printed circuit boards 100A, 100B, 100C and 100D, and therefore redundant description thereof will be omitted.

In the present disclosure, the expression 'covering' may include a case of covering at least a portion as well as a case of covering the whole, and may also include a case of covering not only directly but also indirectly. Furthermore, the expression 'filling' may include not only a case of completely filling but also a case of approximately filling, and may include, for example, a case in which some pores or voids exist.

In the present disclosure, the meaning on the cross-section may refer to a cross-sectional shape when an object is cut vertically, or a cross-sectional shape when the object is viewed in a side-view. Furthermore, the meaning on a plane may refer to a planar shape when the object is horizontally cut, or a planar shape when the object is viewed in a top-view or a bottom-view.

In the present disclosure, a thickness, a width, a length, a depth, and the like may be measured with a scanning microscope or an optical microscope based on a cross-section in which a printed circuit board is polished or cut. The cut cross-section may be a vertical cross-section or a horizontal cross-section, and each numerical value thereof may be measured based on a required cut cross-section. When the numerical value is not constant, the numerical value may be determined as an average value of values measured at any five points. A width of an upper portion and/or a lower portion of a via or a cavity may be measured on a cross-section cut along a central axis of the via or the cavity in the thickness direction of a substrate. A depth of the via or the cavity may be measured as a distance from an upper portion to a lower portion of each object on a cross-section cut along a central axis of each object in a thickness direction of the substrate.

In the present disclosure, a lower side, a lower portion, and a lower surface are used to refer to a downward direction with respect to a cross-section of a drawing, and an upper side, an upper portion, and an upper surface are used to refer to an opposite direction thereof. Furthermore, a side portion, a side surface, and the like, are used to denote directions, perpendicular to upper and lower surfaces. However, this defines the direction for convenience of explanation, and the scope of the rights of the claims is not particularly limited by the description of such a direction, and the concept of upper and lower portions may be changed at any time.

In the present disclosure, a meaning of being connected is a concept including not only directly connected but also indirectly connected through an adhesive layer or the like. Furthermore, a meaning of electrically connected is a concept including both physically connected and not connected. In addition, expressions such as first and second are used to distinguish one component from another, and do not limit the order and/or importance of the components. In some cases, a first component may be referred to as a second component without departing from the scope of rights, or similarly, the second component may be referred to as the first component.

The expression 'example embodiment used in the present disclosure' does not mean the same embodiment, and is provided to explain different unique characteristics. However, the example embodiments presented above do not preclude being implemented in combination with features of other example embodiments. For example, even if matters described in a particular example embodiment are not described in other example embodiments, they may be understood as explanations related to other example embodiments unless there is an explanation contrary to or contradictory to matters in other example embodiments.

The terms used in the present disclosure are used only to describe an example embodiment and are not intended to limit the present disclosure. In this case, singular expressions include plural expressions unless they are clearly meant differently in the context.

What is claimed is:

1. A printed circuit board, comprising:
a first insulating layer;
a cavity unit including a first cavity penetrating through a portion of the first insulating layer from an upper surface of the first insulating layer in a thickness direction, and a second cavity penetrating through another portion of the first insulating layer from the first cavity in the thickness direction;
a first wiring layer disposed at an upper side of the first insulating layer;
a second wiring layer disposed at a lower side of the first insulating layer; and
a third wiring layer at least partially buried in the first insulating layer and disposed on a level between the first and second wiring layers in the thickness direction,
wherein the third wiring layer includes a plurality of pads in which at least a portion of each of upper surfaces thereof is exposed from the first insulating layer through the cavity unit, and
the first cavity has a wider cross-section than the second cavity.

2. The printed circuit board according to claim 1, wherein the first cavity has a deeper depth in the thickness direction than the second cavity.

3. The printed circuit board according to claim 1, wherein the upper surfaces of each of the plurality of pads are recessed downwardly, respectively, based on a surface of the first insulating layer as a bottom surface of the cavity so as to have a step portion from the bottom surface of the cavity.

4. The printed circuit board according to claim 1, wherein at least two of the plurality of pads have different shapes on a plane.

5. The printed circuit board according to claim 1, wherein the first wiring layer includes a first-first wiring layer buried in the upper side of the first insulating layer, and a first-second wiring layer disposed on the upper surface of the first insulating layer,
the first-first and first-second wiring layers are connected to each other, and
a size of a cross-section of the first-second wiring layer is different from the first-first wiring layer.

6. The printed circuit board according to claim 5, wherein the size of the cross-section of the first-second wiring layer is wider than the first-first wiring layer.

7. The printed circuit board according to claim 5, wherein a depth of the first cavity is substantially the same as a thickness of the first-first wiring layer.

8. The printed circuit board according to claim 5, the first-first and first-second wiring layers are in contact with each other.

9. The printed circuit board according to claim 1, further comprising:

a first resist layer disposed on the upper surface of the first insulating layer and having a first opening exposing at least a portion of the first wiring layer, wherein the cavity unit further includes a third cavity connected to the first cavity by penetrating between an upper surface and a lower surface of the first resist layer in the thickness direction, and the third cavity has a wider cross-section than the first cavity.

10. The printed circuit board according to claim 9, further comprising:

a post portion disposed on an upper surface of the first resist layer, disposed in at least a portion of the first opening, and connected to at least an exposed portion of the first wiring layer.

11. The printed circuit board according to claim 1, further comprising:

a second insulating layer disposed on a lower surface of the first insulating layer;

a fourth wiring layer disposed on a lower surface of the second insulating layer;

a first via layer penetrating through the first insulating layer and connecting at least a portion of each of the first and second wiring layers to each other;

a second via layer penetrating through the first insulating layer and connecting at least a portion of each of the second and third wiring layers to each other; and a third via layer penetrating through the second insulating layer and connecting at least a portion of each of the second and fourth wiring layers to each other, wherein the first via layer has a thicker cross-section than the second via layer.

12. The printed circuit board according to claim 11, wherein each of the first to third via layers has a tapered shape in which a width in a lower end thereof is wider than a width in an upper end thereof in a cross-section.

13. The printed circuit board according to claim 11, further comprising:

a second resist layer disposed on the lower surface of the second insulating layer and having a second opening exposing at least a portion of the fourth wiring layer.

14. The printed circuit board according to claim 1, wherein an upper surface of the third wiring layer and a surface of the first insulating layer, exposed by the cavity unit, are disposed on a same level.

15. A printed circuit board, comprising:

a first insulating layer;

a first cavity unit including a first cavity penetrating through a portion of the first insulating layer from an upper surface of the first insulating layer in a thickness direction, and a second cavity penetrating through another portion of the first insulating layer from the first cavity in the thickness direction, a first wiring layer disposed at an upper side of the first insulating layer;

a second wiring layer disposed at a lower side of the first insulating layer; and a third wiring layer at least partially buried in the first insulating layer and disposed on a level between the first and second wiring layers in the thickness direction, wherein the third wiring layer includes a plurality of pads in which at least a portion of each of upper surfaces thereof is exposed from the first insulating layer through the first cavity unit, and the first cavity has a larger area on a plane than the second cavity.

16. The printed circuit board according to claim 15, further comprising:

a first resist layer disposed at the upper side of the first insulating layer and having a first opening exposing at least a portion of the first wiring layer, wherein the first cavity unit further includes a third cavity connected to the first cavity by penetrating between an upper surface and a lower surface of the first resist layer in the thickness direction, and the third cavity has a larger area on a plane than the first cavity.

17. The printed circuit board according to claim 16, further comprising:

a second insulating layer disposed at a lower side of the first insulating layer;

a fourth wiring layer disposed below the second insulating layer;

a first via layer penetrating through the first insulating layer and connecting at least a portion of each of the first and second wiring layers;

a second via layer penetrating through the first insulating layer and connecting at least a portion of each of the second and third wiring layers;

a third via layer penetrating through the second insulating layer and connecting at least a portion of each of the second and fourth wiring layers to each other; and a second resist layer disposed below the second insulating layer and having a second opening exposing at least a portion of the fourth wiring layer.

18. The printed circuit board according to claim 15, further comprising:

an electronic component disposed on the cavity unit and connected to the plurality of pads through a plurality of first electrical connection metals.

19. The printed circuit board according to claim 18, further comprising:

a wiring board having a second cavity unit disposed on the upper surface of the first insulating layer, connected to the first wiring layer through a plurality of second electrical connection metals, and at least partially overlapping the first cavity unit in the thickness direction, wherein the electronic component is disposed between the first insulating layer and the wiring board, and at least a portion and at least another portion of the electronic component are disposed in the first and second cavity units, respectively.

* * * * *